United States Patent [19]

Hamada et al.

[11] 4,204,736
[45] May 27, 1980

[54] METHOD AND DEVICE FOR CONTACT-PRINTING

[75] Inventors: Shinji Hamada, Minami-ashigara; Fumio Hoshino; Junichi Tabata, both of Tokyo, all of Japan

[73] Assignee: Fuji Photo Film Co., Ltd., Kanagawa, Japan

[21] Appl. No.: 31,516

[22] Filed: Apr. 19, 1979

[30] Foreign Application Priority Data

| Apr. 26, 1978 | [JP] | Japan | 53-49460 |
| Jul. 11, 1978 | [JP] | Japan | 53-84259 |
| Jul. 11, 1978 | [JP] | Japan | 53-95317[U] |
| Jul. 18, 1978 | [JP] | Japan | 53-87597 |
| Sep. 6, 1978  | [JP] | Japan | 53-123200[U] |

[51] Int. Cl.² .............................................. G03B 27/04
[52] U.S. Cl. .................................................. 355/118
[58] Field of Search .................. 355/73, 78, 79, 81, 355/84, 85–87, 92, 93, 97, 99, 120, 113, 118

[56] References Cited

U.S. PATENT DOCUMENTS

| 844,135   | 2/1907  | Jungkind        | 355/120  |
| 3,063,337 | 11/1962 | Anander         | 355/73   |
| 3,068,748 | 12/1962 | Schutt et al.   | 355/73   |
| 3,510,217 | 5/1970  | Cirimele et al. | 355/92 X |
| 4,029,404 | 6/1977  | Mizukami et al. | 355/99 X |

Primary Examiner—Richard A. Wintercorn

[57] ABSTRACT

In contact-printing the image of a transmission type original on a photosensitive plate material positioned on a printing stage, the original is in advance fixed to a transparent sheet which is movable between an open position and a closed position. The original is fixed to the transparent sheet at a predetermined position thereon at which the original will be registered with the plate material when the transparent sheet is moved to its closed position. In the open position, the transparent sheet is held away from the printing stage to permit change of the plate material and in the closed position, the transparent sheet sealingly covers the plate material in a predetermined positional relationship therewith and the space under the transparent sheet is evacuated to bring the transparent sheet, the original and the plate material into close contact with each other. Then, the three members are exposed to light.

17 Claims, 18 Drawing Figures

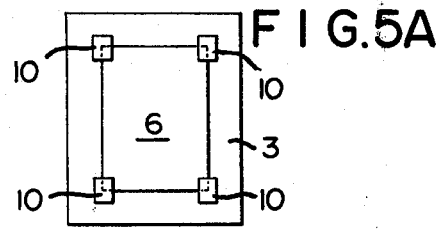
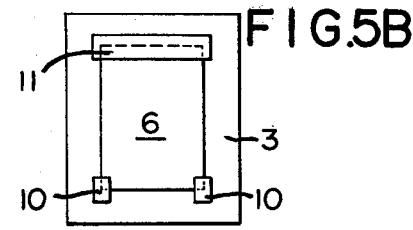
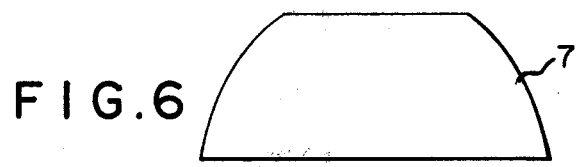
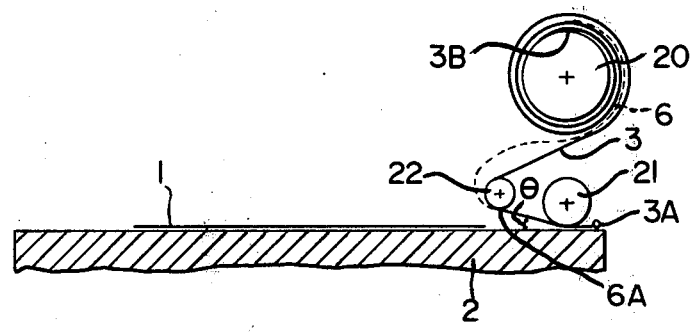
FIG.7
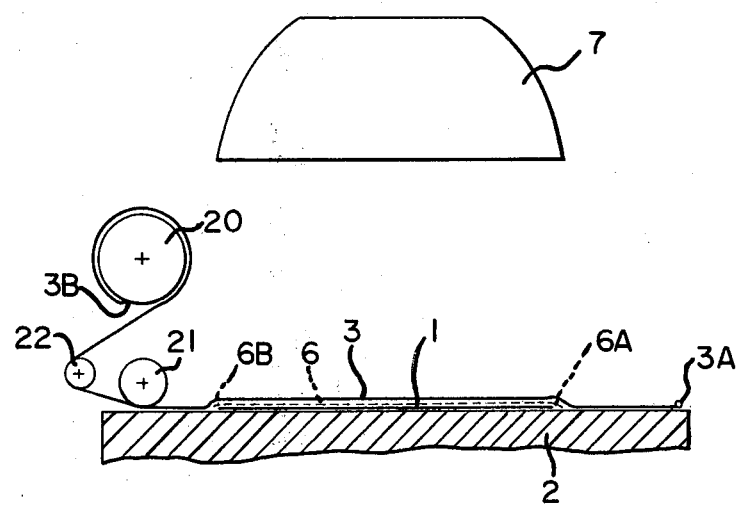

FIG.12
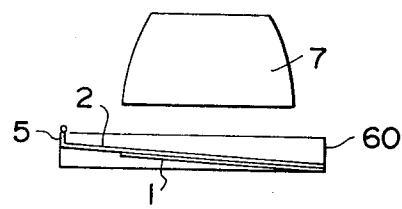
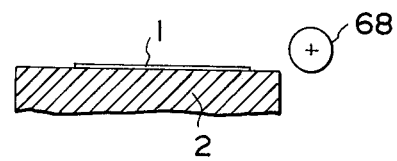
FIG.13
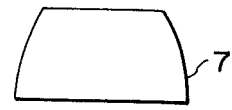
FIG.14
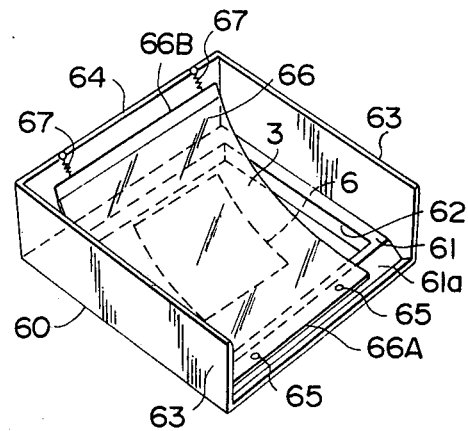

METHOD AND DEVICE FOR CONTACT-PRINTING

BACKGROUND OF THE INVENTION

1. Field of the Invention

This invention relates to a method of and a device for contact-printing the image of a transmission type original on a printing plate material such as photosensitive plastic film, resin plate, metal plate or the like.

2. Description of the Prior Art

In contact-printing the image of a transmission type original on a printing plate material carrying thereon a photosensitive layer, the original is registered with the printing plate material located on a printing stage at a predetermined position and then a flexible transparent sheet is positioned over the original to sealingly cover the original and the plate material. Thereafter, the space under the transparent sheet is evacuated to bring the transparent sheet, the original and the plate material into close contact with each other and the three members are then exposed to light.

In the above processes, it is required that the original be precisely registered with the plate material as well as that these two members be kept in close contact with each other.

In the conventional method, the positioning of the original on the plate material must be carried out every time the plate material is changed even when a plurality of plates are made from a single original. This lowers the efficiency of the operation and makes it difficult to raise efficiency by automatically supplying the plate materials.

SUMMARY OF THE INVENTION

Accordingly, the primary object of the present invention is to provide an improved method of contact-printing the image of a transmission type original on a printing plate material which is especially effective when used to make a plurality of plates from a single original.

Another object of the present invention is to provide an improved method of contact-printing the image of a transmission type original on a printing plate material in which the positioning of the original with respect to the plate material can be automatically carried out in the second and subsequent printings when making a plurality of plates from a single original.

Still another object of the present invention is to provide an improved method of contact-printing the image of a transmission type original on a printing plate material in which the positioning of the original with respect to the plate material can be easily carried out at the time of changing the original.

Still another object of the present invention is to provide a contact-printing device for carrying out the above methods.

In accordance with the present invention a flexible transparent sheet is arranged to take an open position away from a printing stage in which position change of plate material is possible and a closed position in which it sealingly covers the original and the plate material for bringing them into vacuum contact in conjunction with evacuating means. The transparent sheet is kept in a fixed positional relationship with the printing stage or the plate material positioned thereon when positioned in said closed position. The transmission type original is fixed to the transparent sheet at a predetermined position so as to be registered with the plate material on the printing stage when the transparent sheet is in the closed position.

Said transparent sheet preferably should be of a material having low elasticity, high durability and high transparency such as polyethylene terephthalate. The original may be fixed to the transparent sheet by means of known methods, for example, by means of an adhesive tape or by means of an engaging means which engages with the edges or corners of the original. However, it is preferable to avoid use of a substantially thick means.

Further it is preferred that the transparent sheet be provided with a means for facilitating the positioning of the original with respect thereto. Such means may simply be, for example, a straight line with which one end of the original is to be aligned, or marks with which corners of the original are to be aligned.

BRIEF DESCRIPTION OF THE DRAWINGS

FIGS. 5A and 5B are bottom views of a transparent sheet illustrating ways for fixing a transmission type original to a transparent sheet, FIG. 6 is a schematic side elevational view illustrating a contact printing device in accordance with another embodiment of the present invention with the transparent sheet in its open position, FIG. 7 is a schematic side elevational view illustrating the contact printing device of FIG. 6 with the transparent sheet in its closed position, FIG. 12 is a schematic side elevational view illustrating a contact printing device in accordance with still another embodiment of the present invention, FIG. 13 shows the device of FIG. 12 with the transparent sheet in its closed position, FIG. 14 is a perspective view of a cassette frame used in the device of FIGS. 12 and 13.

DESCRIPTION OF THE PREFERRED EMBODIMENTS

Figure 1:
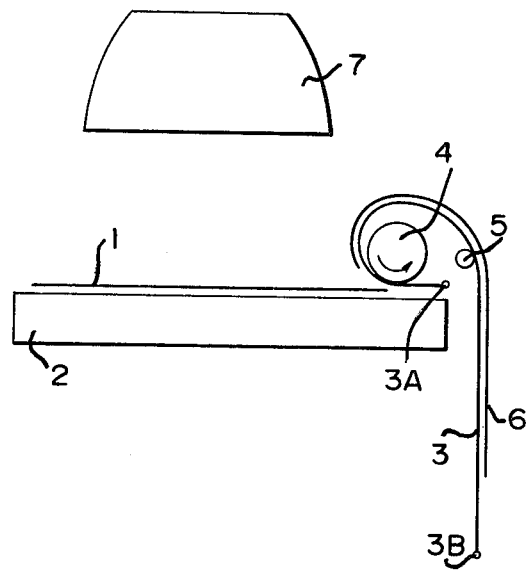
FIGS. 1 to 4 are schematic side elevational views illustrating a contact printing device in accordance with an embodiment of the present invention.

The method of contact-printing of the present invention is especially effective when a single original is repeatedly used to make a plurality of plates therefrom.

In the method of the present invention, the original is fixed to a transparent sheet at a predetermined position in which it is to be registered with a plate material when the transparent sheet is in its closed position. When the plate material is to be changed, the original is moved to its open position together with the transparent sheet on which it is carried and is again moved to its closed position together with the transparent sheet after a new plate material has been set on the printing stage.

Accordingly, in applying this method, the transparent sheet must always be kept in a fixed relationship with the printing stage or the plate material positioned thereon when it is in the closed position. Further, it is required that the original be located precisely in said predetermined position on the transparent sheet at least when the transparent sheet is in the closed position.

Embodiments of contact-printing devices in accordance with the present invention will now be described with reference to the drawings. These embodiments are especially characterized by their means for moving the transparent sheet carrying the original between the open position and the closed position. In the drawings, analogous parts are given the same reference numerals.

FIG. 1 is a schematic side elevational view illustrating a part of a contact-printing device in accordance with an embodiment of the present invention.

In FIG. 1, a plate material 1 is placed on a printing stage 2 at a predetermined position with respect thereto. The printing stage 2 may be of the conventional type provided with an evacuating means (not shown) comprising, for example, evacuating grooves connected to a vacuum pump. The plate material 1 may be placed on the printing stage 2 either manually or automatically. A transparent sheet 3 is fixed to the right end of the printing stage 2 along its one end 3A. At the time the plate material 1 is being changed, the transparent sheet 3 is hung over a squeeze roller 4 and a guide roller 5 with the other end 3B hanging downward as shown.

The squeeze roller 4 is movable back and forth between the extreme right and the extreme left of FIG. 1, in a rolling movement. When the squeeze roller 4 rolls toward the left, it pushes the transparent sheet 3 from its open position shown in FIG. 1 to a closed position in which it lies over the plate material 1.

Although not shown, a guide means guides the transparent sheet 3 so that in its closed position it is placed in a predetermined position with respect to the printing stage 2 or the plate material positioned in place thereon.

A transmission type original 6 is fixed to the transparent sheet 3 at a predetermined position so as to be registered with the plate material 1 when the transparent sheet 3 is in the closed position.

Thus, once the original 6 has been fixed to the transparent sheet 3, it does not require repositioning with respect to the plate material every time the plate material 1 is changed. This is because the original 6 is always brought to precisely the same position each time the transparent sheet 3 is closed.

When said squeeze roller 4 rolls toward the left, it presses the transparent sheet 3 and the original 6 against the plate material 1 and expells any air that may be trapped between the members. Simultaneously, said evacuating means is operated to bring the transparent sheet 3, the original 1 and the plate material 1 into close contact, as is well known in the art. When, the squeeze roller 4 reaches its extreme left position, at which time the transparent sheet 3 is held in its closed position, a light source 7 is operated to expose the plate material 1, the transparent sheet 3 and the original 6.

Thereafter, the evacuating means is de-energized and the squeeze roller 4 is returned to its extreme right position shown in FIG. 1. Then, the transparent sheet 3 together with the original 6 can be returned to its open position in which change of the plate material 1 is possible.

Figure 2:
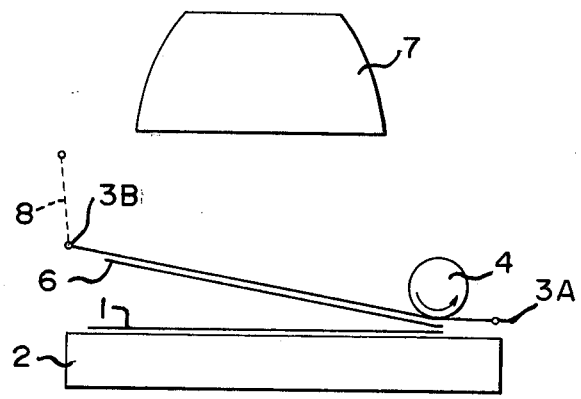

In FIG. 2, which illustrates a contact-printing device in accordance with another embodiment of the present invention, the transparent sheet 3 is likewise fixed to the right end of the printing stage 2 along its one end 3A. The other end 3B of the transparent sheet 3 is urged upward by means of a tension spring 8. Thus the transparent sheet 3 is held in its open position as shown in FIG. 2 by the force of the spring 8 when the squeeze roller 4 is in the extreme right position.

When the squeeze roller 4 rolls toward the left, the transparent sheet 3 is moved toward its closed position overcoming the force of the spring 8.

Figure 3:
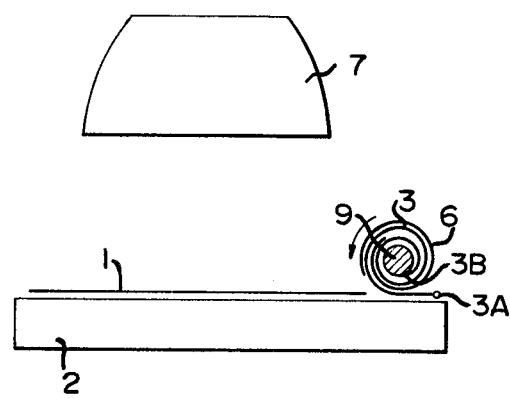

In still another embodiment of the present invention shown in FIG. 3, the transparent sheet 3 together with the original 6 fixed thereto is wound around or taken up by a roller 9 when it is in its open position. One end 3A of the transparent sheet 3 is again fixed to the right end of the printing stage 2 and the other end 3B thereof is fixed over the entire length thereof to the peripheral surface of the roller 9. When the roller 9 rolls toward the left, the transparent sheet 3 together with the original 6 is unwound from the roller 9 to be laid over the plate material 1.

Figure 4:
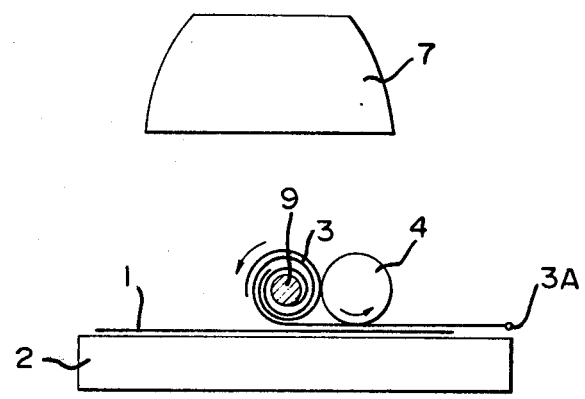

It is preferred that a squeeze roller 4 be provided as shown in FIG. 4 to prevent air from being trapped between the transparent sheet 3, the original 6 and the plate material 1.

In the embodiment shown in FIG. 2, the original 6 may be fixedly attached to the transparent sheet 3 by, for example, fixing each corner thereof to the transparent sheet 3 by means of adhesive tape 10 as shown in FIG. 5A.

However, in case that the transparent sheet 3 and the original 6 attached thereto are subjected to bending or winding as in the embodiments of FIGS. 1, 3 and 4, it is preferred that one end of the original 6 be fixedly attached to the transparent sheet 3 and the other end be attached thereto in a manner that permits sliding movement of the original 6 relative to the transparent sheet 3 in order to accommodate the difference in radii of curvature between the transparent sheet 3 and the original 6.

For example, said the other end of the original 6 may be attached to the transparent sheet 3 by means of an elastic adhesive tape or may be slidably held by a tape 11 which has only its ends secured to the transparent sheet 3 and extends transversely thereto as shown in FIG. 5B. As this latter tape, a thermoactive adhesive tape can be conveniently used with its ends heated and secured to the transparent sheet 3.

In other embodiments shown in FIGS. 6 and 7, FIG. 8 and FIG. 9, the ends of the original 6 may be fixedly attached to the transparent sheet 3, even though the transparent sheet 3 and the original carried thereon are subjected to bending.

In FIG. 6 which shows the transparent sheet 3 in the open position, the transparent sheet 3 and the original 6 fixed thereto at its rear and front ends 6A and 6B are wound around a take-up roller 20 with a part adjacent to the rear end (the right hand end in FIG. 6) 6A of the original 6 being not wound. One end 3A of the transparent sheet 3 is secured to the right end of the printing stage 2 and the other end 3B is secured to the peripheral surface of the take-up roller 20. The transparent sheet 3 is passed between a squeeze roller 21 and the printing stage 2 and runs around a guide roller 22.

The ends 6A and 6B of the original 6 are both fixedly attached to the transparent sheet 3. Therefore, the part of the original 6 adjacent to the rear end 6A thereof is bowed away from the transparent sheet 3 due to the difference in the radii of curvature of the transparent sheet 3 and the original 6. This is the reason why the end part is not wound around the take-up roller 20.

Said three rollers, i.e., the take-up roller 20, guide roller 22 and squeeze roller 21 are moved leftward integrally from the position shown in FIG. 6 to the position shown in FIG. 7 with the squeeze roller 21 and the guide roller 22 being rotated in the counterclockwise direction and the take-up roller 20 being rotated in the clockwise direction to unwind the transparent sheet 3 and the original 6.

Figure 10:
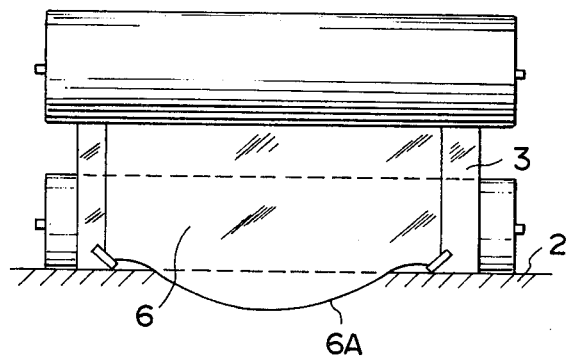
FIG. 10 is an end view of the contact printing device of FIGS. 6 and 7 illustrating the operation of a guide roller thereof.

The guide roller 22 serves to reduce the angle $\theta$ at which the transparent sheet 3 is brought into contact with the upper surface of the printing stage 2 or the plate material 1. When the original 6 is fixed to the transparent sheet 3 only at its corners and if the angle $\theta$ is too large as is the case when the guide roller 22 is not provided, the rear end 6A of the original 6 is apt to be bowed away from the transparent sheet 3 due to rigidity of the original as shown in FIG. 10. When the rear end 6A is bowed away from the transparent sheet 3, the bowed rear end 6A abuts against the upper surface of the printing stage 2 and is adversely creased thereby.

Although, the suitable magnitude of the angle $\theta$ depends on the width of the original 6, generally it should be within a range of $0° < \theta < 15°$.

When the diameter of the squeeze roller 21 is sufficiently large, the guide roller 22 can be dispensed with. However, it is not always possible to use a squeeze roller having a large diameter because of the need to reduce manufacturing cost or to reduce the distance between the printing stage 2 and the light source 7. Of course, if the original 6 is fixed to the transparent sheet 3 at its rear end 6A over the entire length thereof, the above problem would not occur. However, it is much easier to fix only the corners of the original 6 than to fix the end of the original over the entire length thereof.

Said guide roller 22 further serves to extend the effective distance between the take-up roller 20 and the squeeze roller 21 thereby ensuring that said part adjacent to the rear end 6A of the original 6 will not be wound around the take-up roller 20 even if the take-up roller 20 is disposed close to the squeeze roller 21. In place of the rotatable guide roller 22, a non-rotatable guide member having a low frictional resistance such as of fluorine resin can be used.

Figure 8:
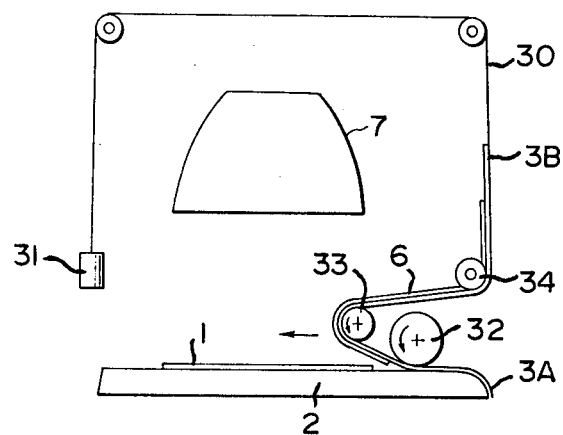
FIGS. 8 and 9 are schematic side elevational views illustrating contact printing devices in accordance with other embodiments of the present invention.

In still another embodiment of the present invention shown in FIG. 8, one end 3A of the transparent sheet 3 is fixed to the right end of the printing stage 2 and the other end 3B is connected to one end of a pair of belt members 30 (only one of which is shown) at the sides of the transparent sheet 3. To the other end of each belt member 30 is connected a weight 31 the weight of which applies a tensile force to the transparent sheet 3 through the belt members 30. Thus, the transparent sheet 3 is urged upward by the weights 31. The transparent sheet 3 is interposed between a squeeze roller 32 and is passed around a movable guide roller 33 and a fixed guide roller 34.

The squeeze roller 32 and the movable guide roller 33 move back and forth integrally with each other and when they move leftward the transparent sheet 3 carrying thereon the original 6 is superposed on the printing stage 2 and the plate material 1 positioned thereon overcoming the weight of the weights 31. When, the squeeze roller 32 and the movable guide roller 33 are returned to their extreme right position, the transparent sheet 3 is returned to its open position shown in FIG. 8 by the weight of the weights 31. The operation of the movable guide roller 33 is substantially the same as that of the guide roller 22 in FIGS. 6 and 7. As was previously described with respect to the guide roller 22, the movable guide roller 33 may be either rotatable or non-rotatable.

Said belt members 30 do not obstruct light from the light source 7 even when the transparent sheet 3 is in its closed position since the belt members 30 are connected to the sides of the transparent sheet 3.

In the embodiment of FIG. 8, the squeeze roller 32 and the movable guide roller 33 are movable, while the printing stage 2 is fixed.

Figure 9:
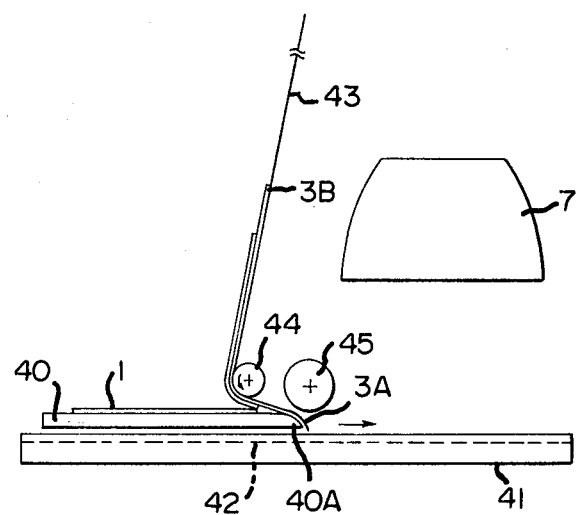

On the contrary, in still another embodiment of the present invention shown in FIG. 9, the printing stage is movable.

In FIG. 9, a printing stage 40 is slidably mounted on a fixed plate member 41 having a pair of guide channels 42. The printing stage 40 is slid guided by the guide channels 42 between a first position in which it is retracted from below the light source 7 as shown in FIG. 9 and a second position in which it is positioned below the light source 7. The plate member 1 is positioned on the movable printing stage 40 and is moved back and forth carried thereby.

One end of the transparent sheet 3 is secured to the leading end 40A of the movable printing stage 40 and the other end 3B thereof is connected to a tension means 43 which upwardly pulls the transparent sheet 3. The transparent sheet 3 is passed around a fixed guide roller 44 from below. A squeeze roller 45 is fixedly mounted adjacent to and above the leading end 40A of the movable printing stage 40 in the first position thereof.

When the movable printing stage 40 is slid rightward toward the second position, the transparent sheet 3 and the original 6 carried thereon are passed below the squeeze roller 45 pulled by the movable printing stage 45 and are pressed by the squeeze roller 45 against the plate material 1 on the movable printing stage 40.

Said fixed guide roller 44 is disposed on the right side of the squeeze roller 45 so that each part of the transparent sheet 3 is first engaged with the fixed guide roller 44 before being engaged by the squeeze roller 45 when the transparent sheet 3 is laid out toward its closed position. Operation of the guide roller 44 is substantially the same as that described above.

In this embodiment, nothing is positioned between the transparent sheet 3 and the light source 7 when the light source 7 is operated. Therefore, the light source 7 can be disposed closer to the printing stage to increase the efficiency thereof.

Figure 11:
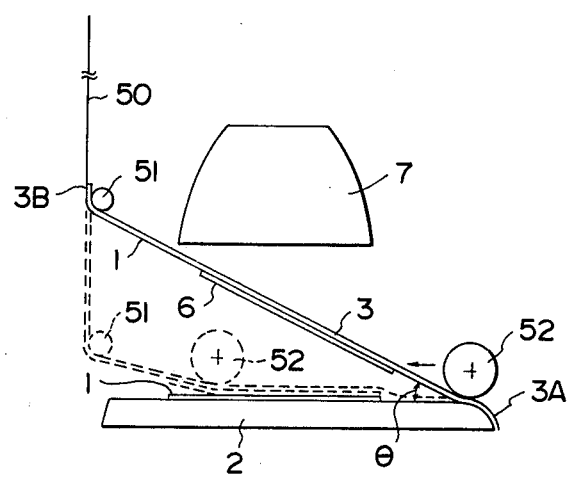
FIG. 11 is a schematic side elevational view illustrating a contact printing device in accordance with still another embodiment of the present invention.

Still another embodiment of the present invention shown in FIG. 11 is similar to the embodiment shown in FIG. 2. The main difference between the embodiments of FIGS. 2 and 11 is that the latter is provided with a means for limiting said angle $\theta$ at which the transparent sheet 3 is brought into contact with the printing stage or the plate material positioned thereon.

One end 3A of the transparent sheet 3 is again secured to the right end of the fixed printing stage 2 and the other end 3B thereof is held above the left hand end of the printing stage 2 by a tension means 50. An up-down member 51 abuts against the transparent sheet 3 from above adjacent to the end 3B thereof.

The up-down member 51 descends to push said other end 3B of the transparent sheet 3 downward to thereby reduce the inclination of the transparent sheet 3 or the angle θ as a squeeze roller 52 rolls leftward to move the transparent sheet 3 to its closed position as indicated by a dotted line in FIG. 11.

The transparent sheet 3 may be fixed to the up-down member 51. In this case, the up-down member 51 is moved in an arc as the squeeze roller 52 rolls back and forth.

In still another embodiment of the present invention shown in FIGS. 12 to 14, the transparent sheet 3 is mounted on a cassette frame to facilitate change of the original 6 and the original 6 is replaced together with the transparent sheet 3 and the cassette frame on which the original 6 is mounted.

In FIG. 12, a cassette frame 60 is arranged to move between its upward and downward positions.

The cassette frame 60 comprises a base wall 61 having therein a large opening 62, a pair of side walls 63 and an end wall 64 upstanding from the base wall 61 as shown in FIG. 14. One end of the cassette frame 60 is open. The base wall 61 is inclined toward the open end to provide a slope surface 61a. To the slope surface 61a are fixed a pair of locating pins 65 which are respectively received in a pair of openings formed in a transparent sheet 66 adjacent to one end 66A thereof. The other end 66B of the transparent sheet 66 is hung from the top of the end wall 64 through a pair of springs 67. Thus, the transparent sheet 66 is held within the cassette frame 60 inclined with respect to the base wall 61.

The transparent sheet 66 is held away from a printing stage 2 when the cassette frame 60 is in the upward position. The cassette frame 60 is lowered to the downward position guided by an appropriate guide means (not shown) and is kept in a fixed relationship with respect to the printing stage 2 in the downward position. When the cassette frame 60 is in the downward position, a plate material positioned on the printing stage 2 is received in the opening 62 of the cassette frame 60. Then, a squeeze roller 68 is rolled into the cassette frame 60 from the open end thereof to press the inclined transparent sheet 66 and an original 6 fixed thereto against the plate material 1 as shown in FIG. 13.

Figure 15:
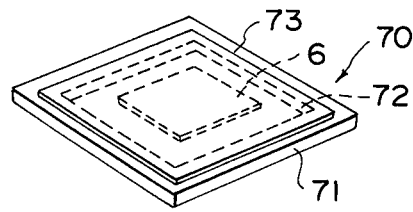
FIG. 15 is a perspective view of another example of a cassette frame.
Figure 16:
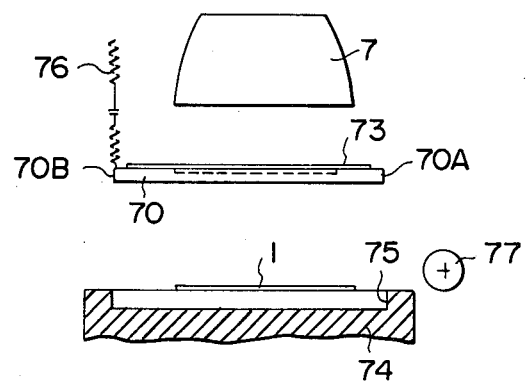
FIG. 16 is a schematic side elevational view illustrating a contact printing device in accordance with another embodiment of the present invention using the cassette frame of FIG. 15.
Figure 17:
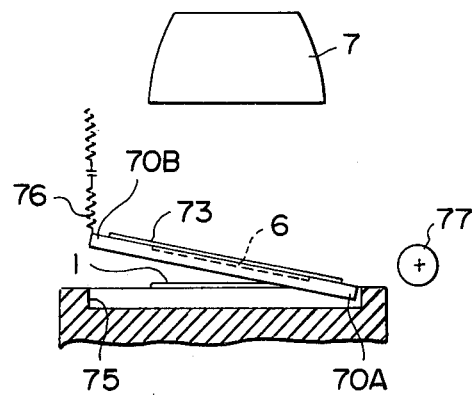
FIG. 17 shows the device of FIG. 16 in an intermediate position between its open and closed positions.

In a modification of this embodiment shown in FIGS. 15 to 17, a cassette frame 70 comprises a rectangular plate member 71 having a large opening 72 therein as shown in FIG. 15. A transparent sheet 73 is secured to the plate member 71 over the opening 72. To the lower surface of the transparent sheet 73 is fixed an original 6.

The transparent sheet 73 and the original 6 fixed thereto are held away from a printing stage 74 when the cassette frame 70 is in its upward position shown in FIG. 16. A guide groove 75 partially surrounds a portion of a printing stage 74 on which a plate material 1 is positioned.

The cassette frame 70 is lowered to its downward position. When the cassette frame 70 is lowered, one end 70A is first engaged with the guide groove 75 in the printing stage 74 with the other end 70B being held away from the printing stage 74 by a tension means 76, whereby the cassette frame 70 is held inclined with respect to the printing stage 74. Then, a squeeze roller 77 is operated to push the inclined cassette frame 70 into the guide groove 75 and to press the transparent sheet 73 and the original 6 against the plate material 1.

We claim:

1. A method of contact-printing the image of a transmission type original on a photosensitive plate material comprising the steps of placing the plate material on a printing stage, superposing the transmission type original on the plate material, sealingly covering the original and the plate material with a transparent sheet, evacuating the space under the transparent sheet to bring the plate material, the original and the transparent sheet into close contact with each other and exposing the plate material, the original and the transparent sheet to light, wherein the improvement comprises fixing said original to said transparent sheet in advance at the position at which the original will be registered with the plate material on the printing stage when the transparent sheet is in its closed position in which the transparent sheet lies over the plate material.

2. A device for contact-printing the image of a transmission type original on a photosensitive plate material, comprising a printing stage having means for positioning said plate material at a predetermined position, a transparent sheet movable between an open position in which it is held away from the printing stage to permit change of the plate material on the printing stage and a closed position in which it sealingly covers the plate material on the printing stage, means for detachably fixing at least a part of said transmission type original to said transparent sheet at a predetermined position at which the original will be registered with the plate material on the printing stage when the transparent sheet is in the closed position, and an evacuating means for evacuating the space under the transparent sheet when the transparent sheet is in the closed position to bring the transparent sheet, the original and the plate material into close contact with each other.

3. A device as defined in claim 2 further comprising a squeeze roller which is movable in rolling movement relative to said printing stage between a first position adjacent to a first end of the printing stage and a second position adjacent to a second end thereof, to rollingly press the transparent sheet and the original fixed thereto against said plate material on the printing stage when the transparent sheet is moved toward the closed position.

4. A device as defined in claim 3 in which said transparent sheet is fixed to the first end of the printing stage at one end thereof, the transparent sheet being held in the open position by being wound around said squeeze roller in the first position, and the transparent sheet being moved toward the closed position unwound from the squeeze roller by rolling the squeeze roller toward the second position.

5. A device as defined in claim 3 in which said transparent sheet is fixed to the first end of the printing stage, and the transparent sheet is held in the open position by being wound around a take-up roller which is arranged to move in rolling movement together with said squeeze roller, the squeeze roller being disposed to be brought into contact with a part of the transparent sheet between the take-up roller and the fixed end of the transparent sheet.

6. A device as defined in claim 5 in which said take-up roller is disposed above the squeeze roller and the transparent sheet is passed around a guide member which is operatively disposed between the take-up roller and the squeeze roller and is moved together therewith, the guide member serving to limit the angle θ at which the transparent sheet is brought into contact with the upper surface of said printing state pressed by the squeeze roller.

7. A device as defined in claim 6 in which said angle $\theta$ is limited to within the range of $0° < \theta < 15°$.

8. A device as defined in claim 6 or 7 in which a part of the transparent sheet adjacent to one end of the original fixed thereto is not wound around the take-up roller.

9. A device as defined in claim 3 in which the transparent sheet is fixed to said first end of the printing stage at one end, and the transparent sheet is held in the open position with the other end thereof being pulled upward by a tension means, the lower portion of the transparent sheet being interposed between said squeeze roller and the printing stage.

10. A device as defined in claim 9 in which said transparent sheet is passed around a guide member which is disposed behind said squeeze roller with respect to the fixed end of the transparent sheet, said guide member serving to limit the angle $\theta$ at which the transparent sheet is brought into contact with the upper surface of said printing stage pressed by the squeeze roller.

11. A device as defined in claim 9 or 10 in which said printing stage is moved with respect to the squeeze roller to bring the transparent sheet into the closed position.

12. A device as defined in claim 3 in which said transparent sheet is fixed to the first end of the printing stage at one end thereof and the transparent sheet is held in the open position with the other end being held above and away from the printing stage by a tension means whereby the transparent sheet is held inclined with respect to the printing stage.

13. A device as defined in claim 12 in which the inclination of the transparent sheet is reduced by depressing the transparent sheet with an up-down member when said squeeze roller rolls toward the second position thereof.

14. A device as defined in claim 3 in which the transparent sheet carrying thereon the transmission type original is held by a cassette frame and the original may be changed together with the transparent sheet and the cassette frame.

15. A device as defined in claim 14 in which the cassette frame is moved up and down between an upward position and a downward position.

16. A device as defined in claim 15 in which the cassette frame is positioned on the printing stage in parallel thereto with the transparent sheet being supported on the cassette frame inclined with respect to the printing stage.

17. A device as defined in claim 15 in which the cassette frame together with the transparent sheet is first positioned on the printing stage inclined with respect thereto and then is brought into a parallel relationship with the printing stage upon being pushed by said squeeze roller.

* * * * *